United States Patent
Robert et al.

(10) Patent No.: US 9,901,014 B2
(45) Date of Patent: Feb. 20, 2018

(54) PERISTALTIC PUMP FOR POWER ELECTRONICS ASSEMBLY

(71) Applicant: Ford Global Technologies, LLC, Dearborn, MI (US)

(72) Inventors: Brian Joseph Robert, St. Clair Shores, MI (US); Serdar Hakki Yonak, Ann Arbor, MI (US); Alvaro Masias, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 32 days.

(21) Appl. No.: 15/099,989

(22) Filed: Apr. 15, 2016

(65) Prior Publication Data

US 2017/0303445 A1    Oct. 19, 2017

(51) Int. Cl.
H05K 7/20 (2006.01)
H01L 23/473 (2006.01)

(52) U.S. Cl.
CPC ....... H05K 7/20927 (2013.01); H01L 23/473 (2013.01); H05K 7/20872 (2013.01)

(58) Field of Classification Search
CPC  H01S 3/09408; H02M 2003/077; H03L 5/02; H02J 3/1864
See application file for complete search history.

(56) References Cited

U.S. PATENT DOCUMENTS

| | | | | |
|---|---|---|---|---|
| 5,131,816 A | * | 7/1992 | Brown | A61M 5/142 128/DIG. 12 |
| 5,863,502 A | * | 1/1999 | Southgate | B01J 19/0046 422/417 |
| 6,116,863 A | * | 9/2000 | Ahn | F04B 43/043 417/322 |
| 6,629,425 B2 | * | 10/2003 | Vaiyapuri | F04B 43/046 165/104.33 |
| 6,730,123 B1 | * | 5/2004 | Klopotek | A61F 2/1613 623/6.22 |
| 2002/0184907 A1 | * | 12/2002 | Vaiyapuri | F04B 43/046 62/259.2 |
| 2003/0199855 A1 | * | 10/2003 | Rogers | A61M 5/14276 604/891.1 |
| 2004/0013545 A1 | * | 1/2004 | Brown | F04B 43/043 417/413.3 |

(Continued)

*Primary Examiner* — Robert J Hoffberg
*Assistant Examiner* — Matt Dhillon
(74) *Attorney, Agent, or Firm* — David B. Kelley; Brooks Kushman P.C.

(57) ABSTRACT

A power electronics assembly may include a power electronics device, a packaging assembly, a thermal management system, and an emitter. The packaging assembly supports power electronics device. The thermal management system supports the packaging assembly and includes a thermal plate to deliver coolant for thermally communicating with the device. The thermal plate defines a channel with a wall. The emitter is arranged with the wall to form a peristaltic pump to adjust a cross-sectional area of the channel to control a flow of coolant therethrough. A membrane may be partially secured to the wall and include one of dielectric particles or magnetic particles. The emitter may selectively output one of a voltage, an electric field, or a magnetic field to impart a force on the particles to move the membrane and adjust the cross-sectional area of the channel to control a flow of coolant therethrough.

16 Claims, 5 Drawing Sheets

(56) References Cited

U.S. PATENT DOCUMENTS

| | | | |
|---|---|---|---|
| 2004/0151629 A1* | 8/2004 | Pease | B01L 3/5027 422/68.1 |
| 2004/0253123 A1* | 12/2004 | Xie | F04B 43/043 417/410.1 |
| 2006/0014083 A1* | 1/2006 | Carlson | B81C 1/00182 430/5 |
| 2008/0158818 A1* | 7/2008 | Clidaras | G06F 1/206 361/699 |
| 2009/0209863 A1* | 8/2009 | Haveri | A61B 8/4483 600/459 |
| 2010/0212762 A1* | 8/2010 | Den Toonder | B01F 13/0059 137/803 |
| 2012/0180979 A1* | 7/2012 | Harrington | F28D 1/0246 165/11.1 |
| 2015/0029658 A1* | 1/2015 | Yairi | G06F 1/20 361/679.47 |
| 2015/0257306 A1* | 9/2015 | Glew | H05K 7/20254 165/104.28 |

\* cited by examiner

PERISTALTIC PUMP FOR POWER ELECTRONICS ASSEMBLY

TECHNICAL FIELD

This disclosure relates to thermal management systems for power electronics assemblies of electrified vehicles.

BACKGROUND

Extended drive range technology for electrified vehicles, such as battery electric vehicles ("BEVs") and plug in hybrid vehicles ("PHEVs"), is continuously improving. Achieving these increased ranges, however, often requires traction batteries, power electronics components, and electric machines to have higher power outputs and associated thermal management systems to have increased capacities in comparison to previous BEVs and PHEVs.

SUMMARY

A power electronics assembly includes a power electronics device, a packaging assembly, a thermal management system, and an emitter. The packaging assembly supports the power electronics device. The thermal management system supports the packaging assembly and includes a thermal plate to deliver coolant for thermally communicating with the power electronics device. The thermal plate defines a channel with a wall. The emitter is arranged with the wall to form a peristaltic pump to adjust a cross-sectional area of the channel to control a flow of coolant therethrough. The packaging assembly may include a dielectric layer disposed between two metallic layers. A membrane may be partially secured to the wall and include one of dielectric particles or magnetic particles. The emitter may selectively output one of a voltage, an electric field, or a magnetic field to impart a force on the particles to move the membrane and adjust the cross-sectional area of the channel to control a flow of coolant therethrough. The wall may include dielectric particles and the emitter may selectively output a voltage or electric field to impart a dielectrically driven compression force on the particles to adjust the cross-sectional area of the channel. The wall may include magnetic particles and the emitter may be an electromagnet to selectively output a magnetic field to impart a force on the particles to adjust the cross-sectional area of the channel. Another power electronics device may be supported by the packaging assembly and located proximate the thermal management system. The channel may be U-shaped and aligned to span adjacent the power electronics devices for targeted coolant delivery. The peristaltic pump may be located adjacent a bend in a conduit system including the channel. The power electronics assembly may include a sensor and a controller. The sensor may measure a flow rate of coolant flowing within the system. The controller may be in electrical communication with the sensor and the emitter and configured to activate the emitter based on signals from the sensor indicating a flow condition outside of a predetermined flow rate range to manipulate a coolant flow rate of at least a portion of the channel.

A power electronics assembly includes first and second thermal plates, a power electronics device, and first and second emitters. Each of the first and second thermal plates includes inner walls and outer walls defining channels between the walls. The power electronics device is disposed between the inner walls. The first and second emitters are arranged with the outer walls to form a pair of peristaltic pumps to impart a force to manipulate a cross-sectional area of the channels to control a rate of coolant flow therethrough. A membrane may be partially secured to each of the outer walls and include one of magnetic or dielectric particles. The first and second emitters output one of a magnetic field, a voltage, or an electric field to move the particles to manipulate the cross-sectional area of the channels. Each of the outer walls may include magnetic particles and the emitters may be electromagnets to selectively output a magnetic field to impart a force on the magnetic particles to adjust the cross-sectional area of the channels. Each of the outer walls may include dielectric particles and the emitters may output a voltage or electric field to impart a dielectrically driven compression force on the particles to adjust a cross-sectional area of the channels to control a flow of the coolant therethrough. The dielectric particles may have one of piezoelectric properties or electrostriction properties. The first and second emitters may be arranged with the first and second thermal plates such that the imparted forces from the emitters are induced in a direction toward one another.

A power electronics assembly includes first and second thermal plates, a pair of power electronics devices, and an emitter. Each of the first and second thermal plates includes a channel defined by inner and outer walls. Each of the pair of power electronics devices is disposed adjacent one of the outer walls. The emitter is arranged with the inner walls to form a peristaltic pump to selectively output a force to move the inner walls and adjust a cross-section of each of the channels to control a flow of coolant therethrough. Each of the inner walls may include actionable particles susceptible to movement based on activation of the emitter. The actionable particles may be magnetic and the emitter may be an electromagnet. The actionable particles may be dielectric and the emitters may output a voltage or electric field. The power electronics assembly may also include a sensor and a controller. The sensor may measure a temperature of one of the power electronics devices. The controller may be in electrical communication with the sensor and the emitter and configured to activate the emitter based on signals from the sensor indicating a temperature above a predetermined threshold to manipulate a coolant flow rate of at least a portion of one of the channels adjacent to one of the power electronics devices. The sensor may measure a flow rate of coolant flowing within one of the channels. The controller may be configured to activate the emitter based on signals from the sensor indicating a flow condition outside of a predetermined flow rate range to manipulate a coolant flow rate of at least a portion of the one of the channels.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ embodiments of the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
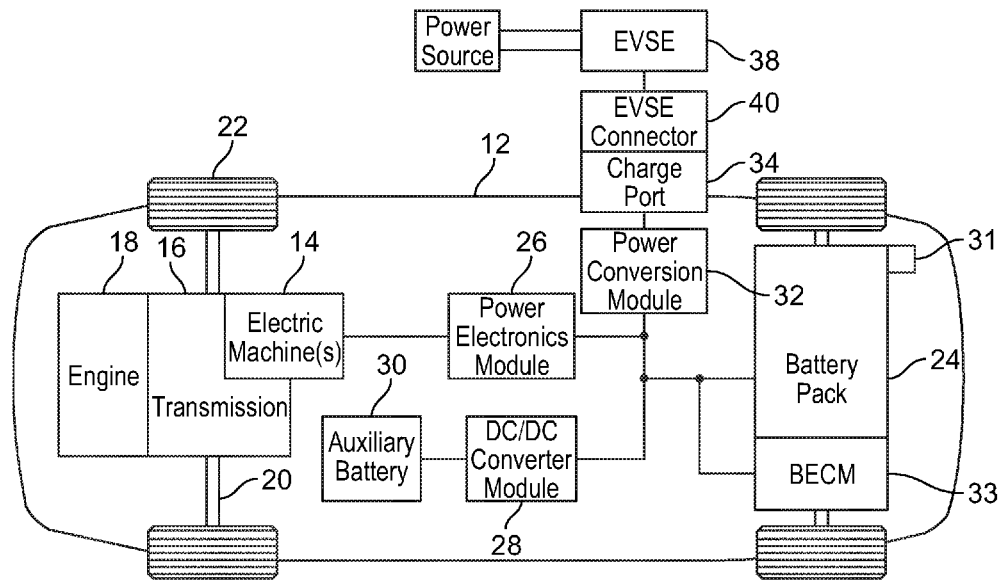
FIG. 1 is a schematic diagram illustrating an example of a battery electric vehicle.

FIG. 1 depicts a schematic of an example of a plug-in hybrid-electric vehicle (PHEV). A vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 may also act as generators and can provide fuel economy benefits by recovering energy that would normally be lost as heat in the friction braking system. The electric machines 14 may also provide reduced pollutant emissions since the vehicle 12 may be operated in electric mode or hybrid mode under certain conditions to reduce overall fuel consumption of the vehicle 12.

A traction battery or battery pack 24 stores and provides energy that can be used by the electric machines 14 or other vehicle 12 components. The traction battery 24 typically provides a high voltage DC output from one or more battery cell arrays, sometimes referred to as battery cell stacks, within the traction battery 24. The high voltage DC output may also be converted to a low voltage DC output for applications such as vehicle stop/start. The battery cell arrays may include one or more battery cells. The traction battery 24 may be electrically connected to one or more power electronics modules 26 through one or more contactors (not shown). The one or more contactors isolate the traction battery 24 from other components when opened and connect the traction battery 24 to other components when closed. The power electronics module 26 is also electrically connected to the electric machines 14 and provides the ability to bi-directionally transfer electrical energy between the traction battery 24 and the electric machines 14. For example, a typical traction battery 24 may provide a DC voltage while the electric machines 14 may require a three-phase AC voltage to function. The power electronics module 26 may convert the DC voltage to a three-phase AC voltage as required by the electric machines 14. In a regenerative mode, the power electronics module 26 may convert the three-phase AC voltage from the electric machines 14 acting as generators to the DC voltage required by the traction battery 24. The description herein is equally applicable to a pure electric vehicle or other hybrid vehicles. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical system may include a power electronics device such as a DC/DC converter module 28 that converts the high voltage DC output of the traction battery 24 to a low voltage DC supply that is compatible with other vehicle loads. Other high-voltage loads, such as compressors and electric heaters, may be connected directly to the high-voltage without the use of a DC/DC converter module 28. In a typical vehicle, the low-voltage systems are electrically connected to an auxiliary battery 30 (e.g., 12V battery).

A battery electrical control module (BECM) 33 is another example of a power electronics device which may be in communication with the traction battery 24. The BECM 33 may act as a controller for the traction battery 24 and may also include an electronic monitoring system that manages temperature and charge state of each of the battery cells. The traction battery 24 may have a temperature sensor 31 such as a thermistor or other temperature gauge. The temperature sensor 31 may be in communication with the BECM 33 to provide temperature data regarding the traction battery 24. The temperature sensor 31 may also be located on or near the battery cells within the traction battery 24. It is also contemplated that more than one temperature sensor 31 may be used to monitor temperature of the battery cells.

The vehicle 12 may be, for example, an electric vehicle such as a PHEV, a FHEV, a MHEV, or a BEV in which the traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of electrical energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34.

The various components discussed may have one or more associated controllers to control and monitor the operation of the components. The controllers may communicate via a serial bus (e.g., Controller Area Network (CAN)) or via discrete conductors.

Figure 2:
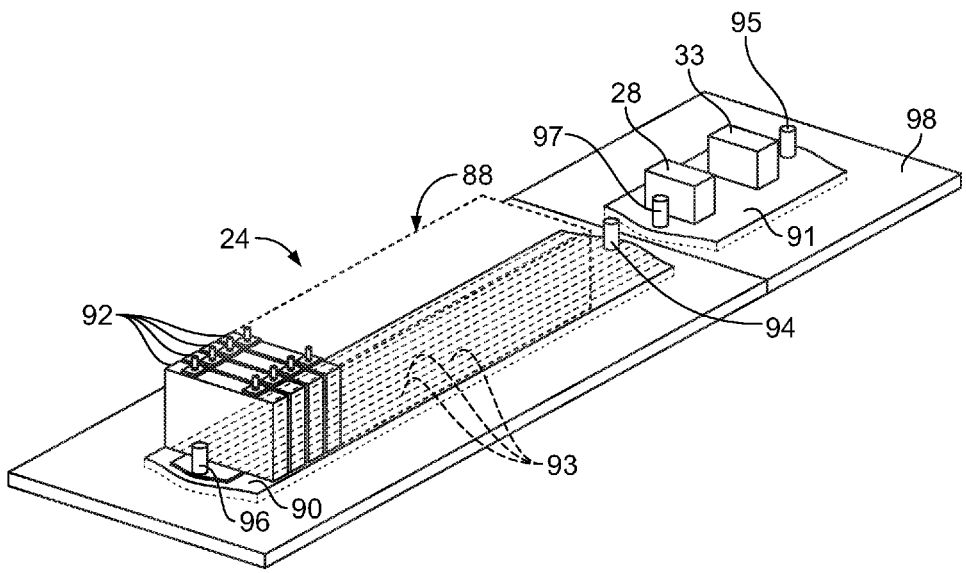
FIG. 2 is a perspective view of an example of a portion of a thermal management system for a traction battery of a battery electric vehicle.

In one example of a liquid thermal management system and now referring to FIG. 2, the traction battery 24 may include a battery cell array 88 shown supported by a thermal plate 90 to be heated and/or cooled by a thermal management system. The battery cell array 88 may include a plurality of battery cells 92 positioned adjacent to one another and structural support components. The DC/DC converter module 28 and/or the BECM 33 may require cooling and/or heating under certain operating conditions. A thermal plate 91 may support the DC/DC converter module 28 and BECM 33 and assist in thermal management thereof. For example, the DC/DC converter module 28 may generate heat during voltage conversion which may need to be dissipated. Alternatively, thermal plates 90 and the thermal plate 91 may be in fluid communication with one another to share a common fluid inlet port and common outlet port.

The thermal plate 91 may include one or more channels and/or a cavity to distribute thermal fluid through the thermal plate 91. For example, the thermal plate 91 may include an inlet port 95 and an outlet port 97 to deliver and remove thermal fluid. Optionally, a sheet of thermal interface material (not shown) may be applied to the thermal plate 91 below the DC/DC converter module 28 and BECM 33. The sheet of thermal interface material may enhance heat transfer between the DC/DC converter module 28 and BECM 33 by filling, for example, voids and/or air gaps between the DC/DC converter module 28 and BECM 33 and the thermal plate 91. The thermal interface material may also provide electrical insulation. A battery tray 98 may support the thermal plate 90, the thermal plate 91, the battery cell array 88, and other components. The battery tray 98 may include one or more recesses to receive thermal plates.

Operations of HV battery system components, such as a power electronics device or power device, benefit from uniform temperature conditions of the components within the HV battery system. Liquid cooled systems typically pump coolant through the system using a closed loop path with one pump. As the coolant flows through the system and draws heat from the components, the coolant accumulates heat and a gradient of temperatures across the system may be created. Further, a coolant flow pattern may be disturbed due to various bends and/or irregular shapes of the coolant path within the system which may also contribute to temperature gradients. HV battery system components may age differently due to varying temperatures during operation of the electrified vehicle. These aging differences may result in performance degradation of the components of the HV battery system and the electrified vehicle.

A peristaltic pump is an example of a positive displacement pump which may be used with a power electronics device or power device to influence a flow of coolant within the system to assist in managing thermal conditions thereof and to combat performance degradation. For example, a peristaltic pump may be based on alternating a compression and a relaxation of a tube or hose to move fluids therein. In one example of a mechanically driven peristaltic pump, a roller may rotate and travel along a length of the tube or hose to compress portions along the length. In another example, a rotor with cams may be located at a bend of the tube or hose. As the rotor rotates, the portions of the tube or hose impacted by the cams are under compression and may be pinched closed. As the tube or hose returns to its natural state after the cam passes, the fluid is induced to move through the system. This process may be referred to as peristalsis.

FIGS. 3 through 6 show an example of a portion of a peristaltic pump assembly in which magnetic field outputs may be used to drive peristalsis of a coolant channel of a thermal management system for components of a power electronics assembly, referred to generally as a coolant channel 100 herein. For example, the power electronics assembly may include a power electronics device or power device located adjacent or proximate the coolant channel 100. In this example, the coolant channel 100 is shown disposed between a first set of electromagnets 120, a second set of electromagnets 124, and a third set of electromagnets 128. While the emitters are shown on both sides of the coolant channel 100 in FIGS. 3 through 6 in this example, it is contemplated that the emitters may be located on only one side of the coolant channel 100. The coolant channel 100 may have various forms and shapes, such as a tube shape. The coolant channel 100 is shown in a first configuration or natural state in FIG. 3. Portions of the coolant channel 100 are shown in compressed states in FIGS. 4 through 6. The coolant channel 100 may be a component of a conduit system to deliver coolant for thermally communicating with a power electronics device or power device and may define a flow path for coolant. Examples of coolant suitable for use with the peristaltic pump assembly include glycol, water, mineral oil, and synthetic oil. The coolant channel 100 may include magnetic particles dispersed throughout a layer 104, dispersed in selected portions of the coolant channel 100, or included in a component secured to the coolant channel 100. The layer 104 may be a flexible layer which may comprise a flexible resin-based material, such as polypropylene. The magnetic particles included with the layer 104 are represented by X's in FIGS. 3 through 6; however multiple configurations of magnetic particles are contemplated. Examples of materials having magnetic particles which may suitable for the layer 104 include magnetic steel and iron.

The sets of electromagnets may operate in a controlled sequence to impart a magnetic field at different portions of the coolant channel 100. A controller (not shown) may be in electrical communication with the sets of electromagnets and may be configured to control operation thereof. The controller may activate the sets of electromagnets in a sequence to facilitate a peristaltic pumping motion in which the cross-sectional area of the coolant channel 100 compresses and expands along a length or portion of the coolant channel 100.

Figure 3:
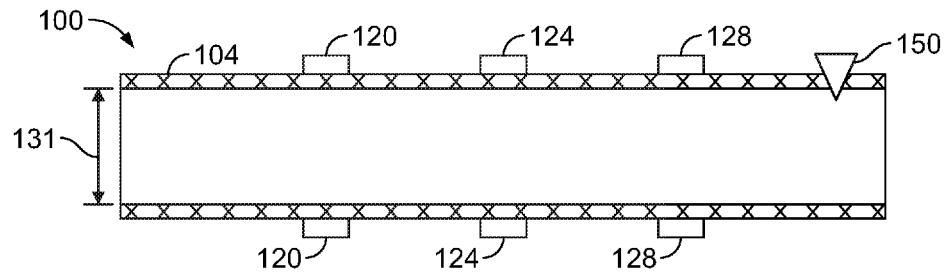
FIG. 3 is an illustrative plan view, in cross-section, of an example of a portion of a peristaltic pump assembly shown in a first configuration.
Figure 4:
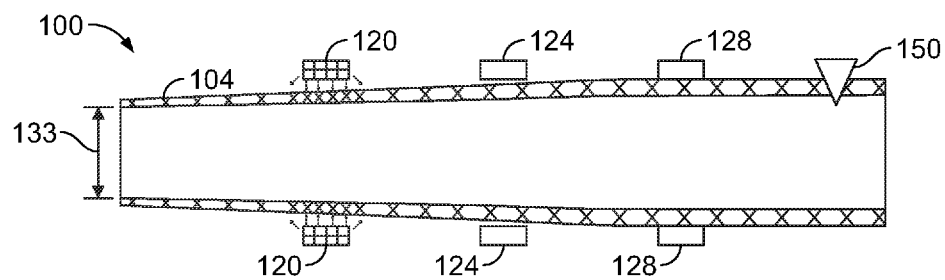
FIG. 4 is an illustrative plan view, in cross-section, of the portion of the peristaltic pump assembly of FIG. 3 shown in a second configuration.

For example, in FIG. 3 the first set of electromagnets 120, the second set of electromagnets 124, and the third set of electromagnets 128 are shown deactivated and the coolant channel 100 is shown in the normal state. Dimension 131 represents a length across the coolant channel 100 in the natural state and may represent a diameter of the coolant channel 100 in a configuration in which the coolant channel 100 is cylindrically tube shaped. In FIG. 4, the first set of electromagnets 120 are shown activated and a portion of the coolant channel 100 proximate thereto is shown compressed as a result of the magnetic field imparting a force (represented by arrows) upon the magnetic particles subject to the magnetic field. Dimension 133 represents a length across the coolant channel 100 at a compressed portion thereof. The dimension 133 may represent a diameter of the coolant channel 100 in a configuration in which the coolant channel 100 is cylindrically tube shaped. The dimension 133 is less than the dimension 131. As such, the magnetic fields from the electromagnets 120 influence the magnetic particles to move and compress the flexible layer 104 to adjust a cross-sectional area of the coolant flow path defined by the coolant channel 100.

Figure 5:
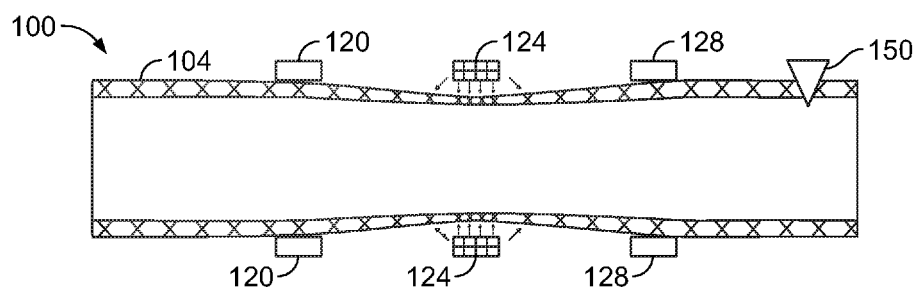
FIG. 5 is an illustrative plan view, in cross-section, of the portion of the peristaltic pump assembly of FIG. 3 shown in a third configuration.
Figure 6:
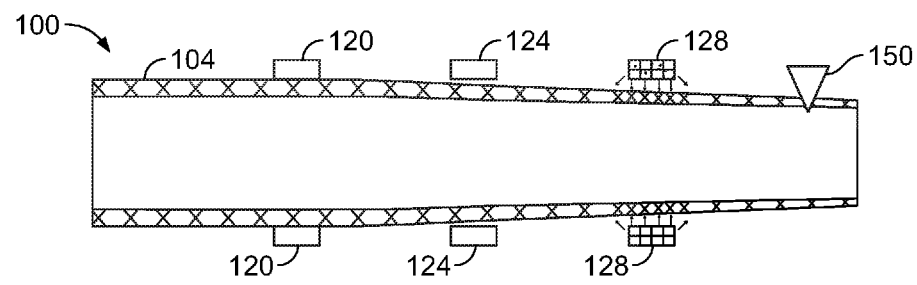
FIG. 6 is an illustrative plan view, in cross-section, of the portion of the peristaltic pump assembly of FIG. 3 shown in a fourth configuration.

In FIG. 5, the second set of electromagnets 124 are shown activated and a portion of the coolant channel 100 proximate thereto is shown compressed as a result of the magnetic field imparting a force upon magnetic particles subject to the magnetic field. In FIG. 6, the third set of electromagnets 128 are shown activated and a portion of the coolant channel 100 proximate thereto is shown compressed as a result of the magnetic field imparting a force upon magnetic particles subject to the magnetic field. Subsequent activation of the sets of electromagnets compresses and then releases portions of the coolant channel 100 to promote peristalsis along the coolant channel 100. Flow rates of coolant traveling through the coolant channel 100 may thus be controlled with various sequences of activating and deactivating the sets of electromagnets.

The controller may also be configured to operate with one or more sensors. The peristaltic pump system may include a sensor 150. The sensor 150 may be a flow rate sensor. In another example, a temperature sensor (not shown) may be arranged with the power electronics device or power device to monitor temperature conditions thereof. The controller may be in electrical communication with the sensor 150 to selectively activate the sets of electromagnets based on signals received therefrom. In response to receiving the signals, the controller may appropriately adjust a flow rate of the coolant within the coolant channel 100 by controlling operation of the sets of electromagnets.

FIGS. 7 through 10 show an example of a portion of a peristaltic pump assembly in which voltage outputs may be used to drive peristalsis of a coolant channel, having piezoelectric materials, of a thermal management system for a power electronics assembly, referred to generally as a coolant channel 200 herein. For example, the power electronics assembly may include a power electronics device or power device located adjacent or proximate the coolant channel 200. In this example, the coolant channel 200 is shown disposed between a first set of emitters 220, a second set of emitters 224, and a third set of emitters 228. While the emitters are shown on both sides of the coolant channel 200 in FIGS. 7 through 10 in this example, it is contemplated that the emitters may be located on only one side of the coolant channel 200. The coolant channel 200 may have various forms and shapes, such as a tube shape. The coolant channel 200 is shown in a first configuration or natural state in FIG. 7. Portions of the coolant channel 200 are shown in compressed states in FIGS. 8 through 10. The coolant channel 200 may be a component of a conduit system to deliver coolant for thermally communicating with the power electronics device or the power device and may define a flow path for coolant. Examples of coolant suitable for use with the peristaltic pump assembly include glycol, water, mineral oil, and synthetic oil. The coolant channel 200 may include dielectric particles dispersed throughout a layer 204, dispersed in selected portions of the coolant channel 200, or included in a component secured to the coolant channel 200. The layer 204 may be a flexible layer which may comprise a flexible resin-based material, such as polypropylene. The dielectric particles may have piezoelectric or electrostriction properties. Examples of suitable piezoelectric materials for the coolant channel 200 include quartz, lead zirconate titanate, and barium titanate.

The sets of emitters may operate in a controlled sequence to impart a voltage at different portions of the coolant channel 200. A controller (not shown) may be in electrical communication with the sets of emitters and may be configured to control operation thereof. The controller may activate the sets of emitters in a sequence to facilitate a peristaltic pumping motion in which the cross-sectional area of the coolant channel 200 compresses and expands along a length or portion of the coolant channel 200.

Figure 7:
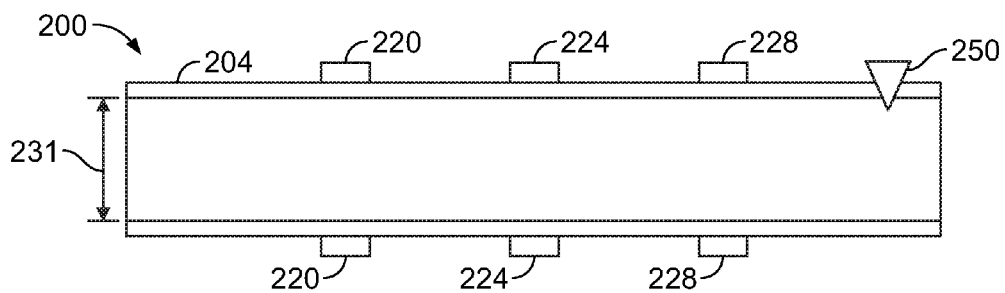
FIG. 7 is an illustrative plan view, in cross-section, of an example of a portion of a peristaltic pump assembly shown in a first configuration.
Figure 8:
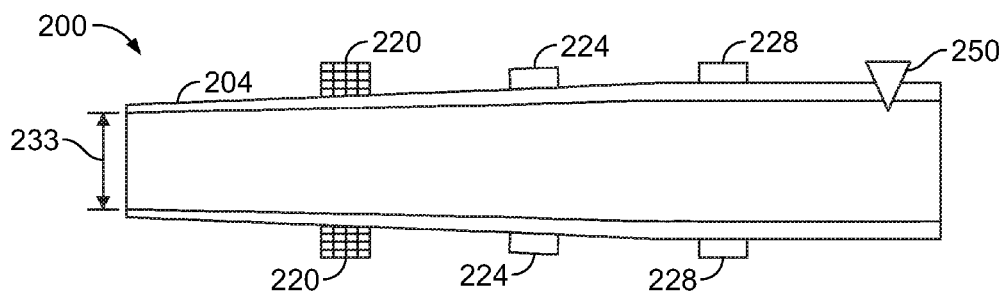
FIG. 8 is an illustrative plan view, in cross-section, of the portion of the peristaltic pump assembly of FIG. 7 shown in a second configuration.

For example, in FIG. 7 the first set of emitters 220, the second set of emitters 224, and the third set of emitters 228 are shown deactivated and the coolant channel 200 is shown in the normal state. Dimension 231 represents a length across the coolant channel 200 in the natural state and may represent a diameter of the coolant channel 200 in a configuration in which the coolant channel 200 is cylindrically tube shaped. In FIG. 8, the first set of emitters 220 are shown activated and a portion of the coolant channel 200 proximate thereto is shown compressed as a result of the voltage imparting a force (represented by arrows) upon the dielectric particles subject to the voltage. Dimension 233 represents a length across the coolant channel 200 at a compressed portion thereof. The dimension 233 may represent a diameter of the coolant channel 200 in a configuration in which the coolant channel 200 is cylindrically tube shaped. As such, the voltage from the emitters 220 influence the dielectric particles to move and compress the flexible layer 204 to adjust a cross-sectional area of the coolant flow path defined by the coolant channel 200.

Figure 9:
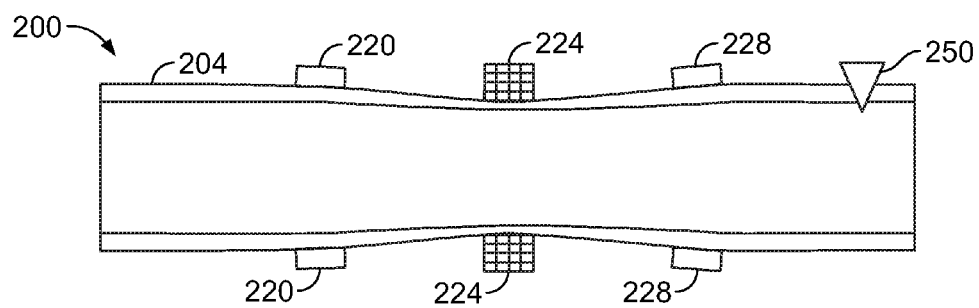
FIG. 9 is an illustrative plan view, in cross-section, of the portion of the peristaltic pump assembly of FIG. 7 shown in a third configuration.
Figure 10:
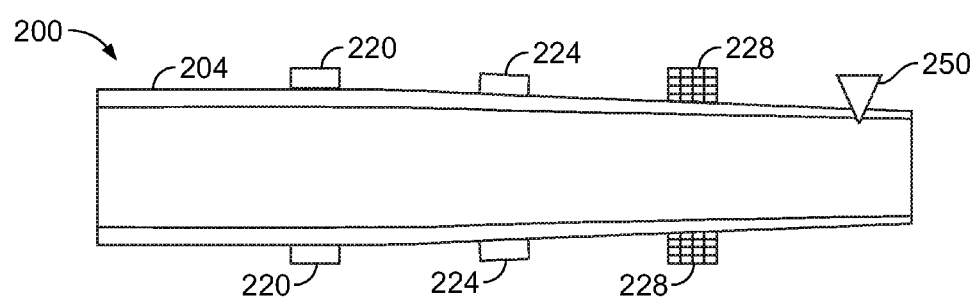
FIG. 10 is an illustrative plan view, in cross-section, of the portion of the peristaltic pump assembly of FIG. 7 shown in a fourth configuration.

In FIG. 9, the second set of emitters 224 are shown activated and a portion of the coolant channel 200 proximate thereto is shown compressed as a result of the voltage imparting a force upon the dielectric materials subject to the voltage. In FIG. 10, the third set of emitters 228 are shown activated and a portion of the coolant channel 200 proximate thereto is shown compressed as a result of the voltage imparting a force upon the dielectric materials subject to the voltage. Subsequent activation of the sets of emitters compresses and then releases portions of the coolant channel 200 to promote peristalsis along the coolant channel 200. Flow rates of coolant traveling through the coolant channel 200 may thus be controlled with various sequences of activating and deactivating the sets of emitters.

The controller may also be configured to operate with one or more sensors. The peristaltic pump system may include a sensor 250. The sensor 250 may be a flow rate sensor. In another example, a temperature sensor (not shown) may be arranged with the power electronics device or power device to monitor temperature conditions thereof. The controller may be in electrical communication with the sensor 250 to selectively activate the sets of emitters based on signals received therefrom. In response to receiving the signals, the controller may appropriately adjust a flow rate of the coolant within the coolant channel 200 by controlling operation of the sets of emitters.

Figure 11:
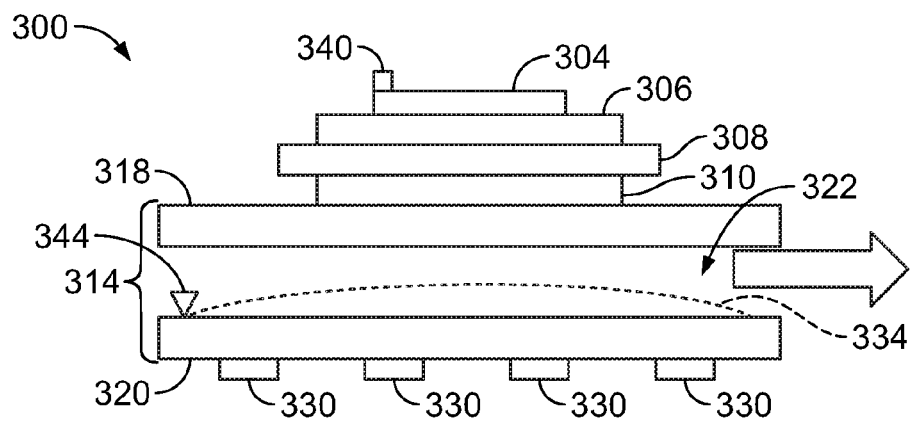
FIG. 11 is a schematic diagram of an example of a portion of a power electronics assembly.

FIG. 11 shows an example of a portion of a power electronics assembly, referred to generally a power electronics assembly 300 herein. The power electronics assembly 300 may include a module including a power device 304, a first layer 306, a dielectric 308, and a second layer 310. The first layer 306, the dielectric 308, and the second layer 310 may form a packaging assembly supporting the power device 304. Examples of the power device 304 may include transistors, diodes, or other similar components. Suitable materials for the first layer 306 and the second layer 310 may include aluminum and copper. The first layer 306 and the second layer 310 may be part of an electrical circuit to communicate signals of the power device 304 to other vehicle components. Suitable materials for the dielectric 308 may include aluminum oxide, aluminum nitride, and silicon nitride ceramics. A thermal plate 314 may support the packaging assembly thereupon. The thermal plate 314 may include a first wall 318 and a second wall 320. The first wall 318 and the second wall 320 may define a coolant channel 322 therebetween. The thermal plate 314 may be arranged with the power device 304 such that coolant flowing within the coolant channel 322 is in thermal communication with the power device 304. Coolant flowing within the coolant channel 322 may assist in managing thermal conditions, such as a temperature, of the power device 304 by drawing heat therefrom.

The second wall 320 may include particles which are actionable when subject to external forces. For example, the second wall 320 may include magnetic particles or dielectric particles. A force may be imparted on the magnetic particles by an electromagnet or a force may be imparted on the dielectric particles by a voltage or electric field. Positioning an emitter adjacent the second wall 320 may provide a peristaltic pump to impart a force upon the second wall 320 to adjust a cross-sectional area of a portion of the coolant channel 322. By adjusting this cross-sectional area, the peristaltic pump may operate to control a flow of coolant within the coolant channel 322.

For example, one or more emitters 330 may be mounted to an exterior of the second wall 320 and/or may be located adjacent the second wall 320. The one or more emitters 330 may output a magnetic field, a voltage, or an electric field in accordance with the type of particles included in the second wall 320 such that the one or more emitters 330 and the second wall 320 operate as a peristaltic pump. In FIG. 11, interior emitters of the one or more emitters 330 are activated to impart a force on particles within the second wall 320 resulting in another configuration for the second wall 320, represented by line 334 shown as a broken line, to adjust a cross-sectional area of the coolant channel 322. Optionally, the line 334 may represent a membrane partially secured to the second wall 320 which may include actionable particles such that the membrane may move in response to the outputted magnetic field, voltage, or electric field. Activation of the emitters may drive a peristaltic motion to control a flow rate of the coolant flowing within coolant channel 322. A control system may operate with the one or more emitters 330 to adjust output of the peristaltic pump based on predetermined thresholds for operating conditions of the power electronics assembly 300.

For example, a first sensor 340 may be in thermal communication with the power device 304 to monitor thermal conditions, such as temperature, of the power device. A second sensor 344 may be disposed within the coolant channel 322 to monitor a flow rate of coolant flowing therethrough. A controller (not shown) may be in electrical communication with the first sensor 340, the second sensor 344, and the one or more emitters 330. The controller may operate to control output of the one or more emitters 330 based on signals received from the first sensor 340 and the second sensor 344. For example, a flow rate of coolant within the coolant channel 322 may be adjusted in response to, for example, a temperature of the power device 304 or a coolant flow rate of the coolant channel 322 being outside of a predetermined threshold. This example including the thermal plate 314 may be referred to as a single-sided thermal management system for a power electronics assembly.

Figure 12:
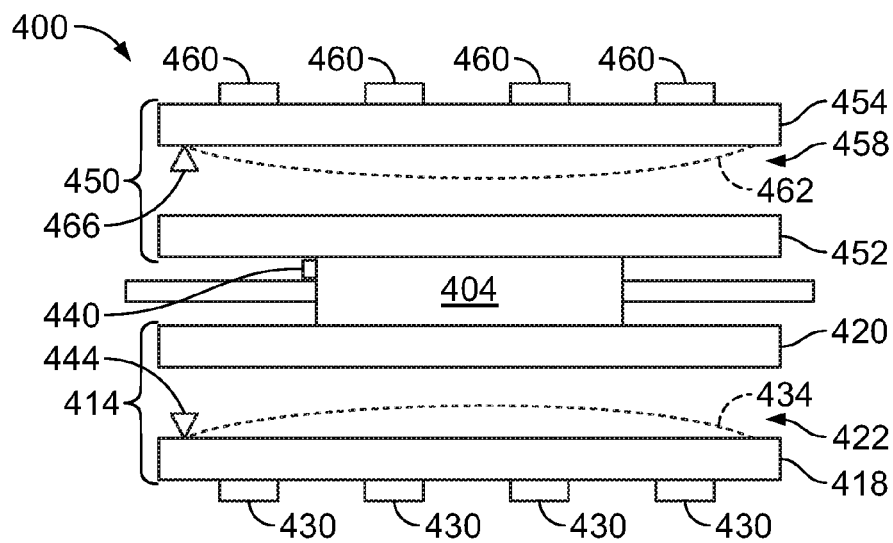
FIG. 12 is a schematic diagram of an example of a portion of a power electronics assembly.

FIG. 12 shows an example of a portion of a power electronics assembly, referred to generally as a power electronics assembly 400 herein. The power electronics assembly 400 may include a module 404. Examples of components of the module 404 may include an AC/DC inverter, a DC/DC booster converter, or a power conversion module. The module 404 may include one or more power devices such as transistors or diodes. The module 404 may include a stack of metallic and dielectric layers as described above. A first thermal plate 414 may support the module 404 thereupon. The first thermal plate 414 may include a first wall 418 and a second wall 420. The first wall 418 and the second wall 420 may define a coolant channel 422 therebetween. The first thermal plate 414 may be arranged with the module 404 such that coolant flowing within the coolant channel 422 is in thermal communication with the module 404 and components thereof. Coolant flowing within the coolant channel 422 may assist in managing thermal conditions, such as a temperature, of the module 404 by drawing heat therefrom.

The second wall 420 may include particles which are actionable when subject to external forces. For example, the second wall 420 may include magnetic particles or dielectric particles. A force may be imparted on the magnetic particles by an electromagnet or a force may be imparted on the dielectric particles by a voltage or electric field. Positioning an emitter adjacent the second wall 420 may provide a peristaltic pump to impart a force upon the second wall 420 to adjust a cross-sectional area of a portion of the coolant channel 422. By adjusting this cross-sectional area, the peristaltic pump may operate to control a flow of coolant within the coolant channel 422.

For example, one or more emitters 430 may be mounted to an exterior of the second wall 420 and/or may be located adjacent the second wall 420. The one or more emitters 430 may output a magnetic field, a voltage, or an electric field in accordance with the type of particles included in the second wall 420 such that the one or more emitters 430 and the second wall 420 operate as a peristaltic pump. In FIG. 12, interior emitters of the one or more emitters 430 are activated to impart a force on particles within the second wall 420 resulting in another configuration for the second wall 420, represented by line 434 shown in a broken line, to adjust a cross-sectional area of the coolant channel 422. Optionally, the line 434 may represent a membrane partially secured to the second wall 320 which may include actionable particles such that the membrane may move in response to the outputted magnetic field, voltage, or electric field. Activation of the emitters may drive a peristaltic motion to control a flow rate of the coolant flowing within coolant channel 422.

A control system may operate with the one or more emitters 430 to adjust output of the peristaltic pump based on predetermined thresholds for operating conditions of the power electronics assembly 400. For example, a first sensor 440 may be in thermal communication with the power module 404 to monitor thermal conditions, such as temperature, of the power module 404. A second sensor 444 may be disposed within the coolant channel 422 to monitor a flow rate of coolant flowing therethrough. A controller (not shown) may be in electrical communication with the first sensor 440, the second sensor 444, and the one or more emitters 430. The controller may operate to control output of the one or more emitters 430 based on signals received from the first sensor 440 and the second sensor 444. For example, a flow rate of coolant within the coolant channel 422 may be adjusted in response to, for example, a temperature of the power module 404 or a coolant flow rate of the coolant channel 422 being outside of a predetermined threshold.

A second thermal plate 450 may be mounted to a side of the power module 404 opposite the first thermal plate 414. This example including the first thermal plate 414 and the second thermal plate 450 may be referred to as a double-sided thermal management system for a power electronics assembly. The second thermal plate 450 may include a first wall 452 and a second wall 454. The first wall 452 and the second wall 454 may define a coolant channel 458 therebetween. The second thermal plate 450 may be arranged with the module 404 such that coolant flowing within the coolant channel 458 is in thermal communication with the module 404 and components thereof. Coolant flowing within the coolant channel 458 may assist in managing thermal conditions, such as a temperature, of the module 404 by drawing heat therefrom.

The second wall 454 may include particles which are actionable when subject to external forces. For example, the second wall 454 may include magnetic particles or dielectric particles. A force may be imparted on the magnetic particles by an electromagnet or a force may be imparted on the dielectric particles by a voltage or electric field. Positioning an emitter adjacent the second wall 454 may provide a peristaltic pump to impart a force upon the second wall 454 to adjust a cross-sectional area of a portion of the coolant channel 458. By adjusting this cross-sectional area, the peristaltic pump may operate to control a flow of coolant within the coolant channel 458.

For example, one or more emitters 460 may be mounted to an exterior of the second wall 454 and/or may be located adjacent the second wall 454. The one or more emitters 460 may output a magnetic field, a voltage, or an electric field in accordance with the type of particles included in the second wall 454 such that the one or more emitters 460 and the second wall 454 operate as a peristaltic pump. In FIG. 12, interior emitters of the one or more emitters 460 are activated to impart a force on particles within the second wall 454 resulting in another configuration for the second wall 454, represented by line 462 shown in a broken line, to adjust a cross-sectional area of the coolant channel 458. Optionally, the line 462 may represent a membrane partially secured to the second wall 320 which may include actionable particles such that the membrane may move in response to the outputted magnetic field, voltage, or electric field. Activation of the emitters may drive a peristaltic motion to control a flow rate of the coolant flowing within coolant channel 458.

The control system may operate with the one or more emitters 460 to adjust output of the peristaltic pump based on predetermined thresholds for operating conditions of the power electronics assembly 400. As mentioned above, the first sensor 440 may be in thermal communication with the power module 404 to monitor thermal conditions, such as temperature, of the power module 404. A third sensor 466 may be disposed within the coolant channel 458 to monitor a flow rate of coolant flowing therethrough. A controller (not shown) may be in electrical communication with the first sensor 440, the third sensor 466, and the one or more emitters 460. The controller may operate to control output of the one or more emitters 460 based on signals received from the first sensor 440 and the third sensor 466. For example, a flow rate of coolant within the coolant channel 458 may be adjusted in response to, for example, a temperature of the power module 404 or a coolant flow rate of the coolant channel 458 being outside of a predetermined threshold.

Figure 13:
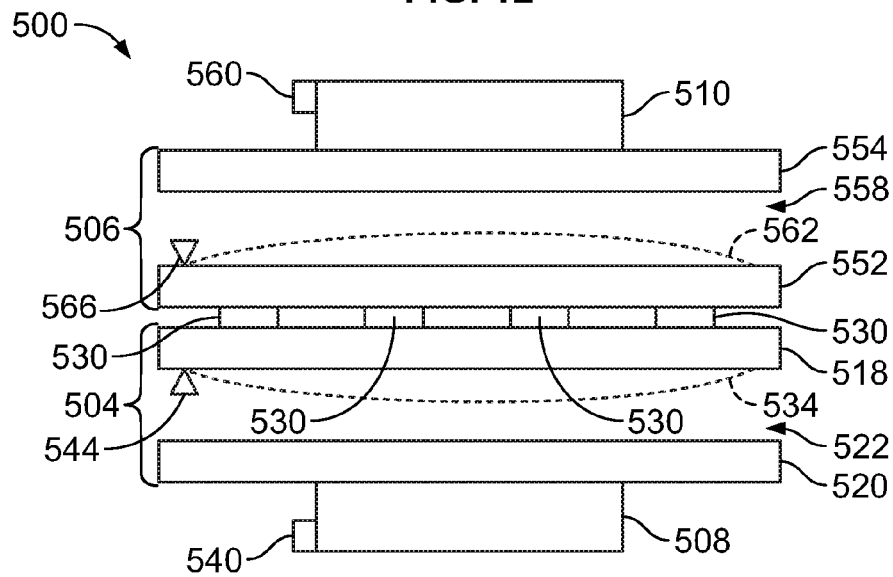
FIG. 13 is a schematic diagram of an example of a portion of a power electronics assembly.

FIG. 13 shows an example or a portion of a power electronics assembly, referred to generally as a power electronics assembly 500 herein. The power electronics assembly 500 may include a first thermal plate 504, a second thermal plate 506, a first power electronics module 508, and a second power electronics module 510. The first power electronics module 508 may be secured to the first thermal plate 504 and the second power electronics module 510 may be secured to the second thermal plate 506. The first power electronics module 508 and the second power electronics module 510 may include an AC/DC inverter, a DC/DC booster converter, a power conversion module, or one or more power devices such as transistors or diodes. The first power electronics module 508 and the second power electronics module 510 may include a stack of metallic and dielectric layers as described above.

The first thermal plate 504 may include a first wall 518 and a second wall 520. The first wall 518 and the second wall 520 may define a coolant channel 522 therebetween. The first thermal plate 504 may be arranged with the module 508 such that coolant flowing within the coolant channel 522 is in thermal communication with the module 508 and components thereof. Coolant flowing within the coolant channel 522 may assist in managing thermal conditions, such as a temperature, of the module 508 by drawing heat therefrom.

The second wall 520 may include particles which are actionable when subject to external forces. For example, the second wall 520 may include magnetic particles or dielectric particles. A force may be imparted on the magnetic particles by an electromagnet or a force may be imparted on the dielectric particles by a voltage or electric field. Positioning an emitter adjacent the second wall 520 may provide a peristaltic pump to impart a force upon the second wall 520 to adjust a cross-sectional area of a portion of the coolant channel 522. By adjusting this cross-sectional area, the peristaltic pump may operate to control a flow of coolant within the coolant channel 522.

For example, one or more emitters 530 may be disposed between the thermal plates and mounted to an exterior of the second wall 520 and/or may be located adjacent the second wall 520. The one or more emitters 530 may output a magnetic field, a voltage, or an electric field in accordance with the type of particles included in the second wall 520 such that the one or more emitters 530 and the second wall 520 operate as a peristaltic pump. In FIG. 13, interior emitters of the one or more emitters 530 are activated to impart a force on particles within the second wall 520 resulting in another configuration for the second wall 520, represented by line 534 shown in a broken line, to adjust a cross-sectional area of the coolant channel 522. Optionally, the line 534 may represent a membrane partially secured to the second wall 320 which may include actionable particles such that the membrane may move in response to the outputted magnetic field, voltage, or electric field. Activation of the emitters may drive a peristaltic motion to control a flow rate of the coolant flowing within coolant channel 522.

A control system may operate with the one or more emitters 530 to adjust output of the peristaltic pump based on predetermined thresholds for operating conditions of the power electronics assembly 500. For example, a first sensor 540 may be in thermal communication with the module 508 to monitor thermal conditions, such as temperature, of the module 508. A second sensor 544 may be disposed within the coolant channel 522 to monitor a flow rate of coolant flowing therethrough. A controller (not shown) may be in electrical communication with the first sensor 540, the second sensor 544, and the one or more emitters 530. The controller may operate to control output of the one or more emitters 530 based on signals received from the first sensor 540 and the second sensor 544. For example, a flow rate of coolant within the coolant channel 522 may be adjusted in response to, for example, a temperature of the module 508 or a coolant flow rate of the coolant channel 522 being outside of a predetermined threshold.

This example including the first thermal plate 504 and the second thermal plate 506 may be referred to as a dual-cooling thermal management system for a power electronics assembly. The second thermal plate 506 may include a first wall 552 and a second wall 554. The first wall 552 and the second wall 554 may define a coolant channel 558 therebetween. The second thermal plate 506 may be arranged with the module 510 such that coolant flowing within the coolant channel 558 is in thermal communication with the module 210 and components thereof. Coolant flowing within the coolant channel 558 may assist in managing thermal conditions, such as a temperature, of the module 510 by drawing heat therefrom.

The second wall 554 may include particles which are actionable when subject to external forces. For example, the second wall 554 may include magnetic particles or dielectric particles. A force may be imparted on the magnetic particles by an electromagnet or a force may be imparted on the dielectric particles by a voltage or electric field. Positioning an emitter adjacent the second wall 554 may provide a peristaltic pump to impart a force upon the second wall 554 to adjust a cross-sectional area of a portion of the coolant channel 558. By adjusting this cross-sectional area, the peristaltic pump may operate to control a flow of coolant within the coolant channel 558.

For example, the one or more emitters 530 may disposed between the thermal plates, mounted to an exterior of the second wall 554 and/or may be located adjacent the second wall 554. The one or more emitters 530 may output a magnetic field, a voltage, or an electric field in accordance with the type of particles included in the second wall 554 such that the one or more emitters 530 and the second wall 554 operate as a peristaltic pump. In FIG. 13, interior emitters of the one or more emitters 530 are activated to impart a force on particles within the second wall 554 resulting in another configuration for the second wall 554, represented by line 562 shown in a broken line, to adjust a cross-sectional area of the coolant channel 558. Optionally, the line 562 may represent a membrane partially secured to the second wall 320 which may include actionable particles such that the membrane may move in response to the outputted magnetic field, voltage, or electric field. Activation of the emitters may drive a peristaltic motion to control a flow rate of the coolant flowing within coolant channel 558.

The control system may operate with the one or more emitters 530 to adjust output of the peristaltic pump based on predetermined thresholds for operating conditions of the power electronics assembly 500. A third sensor 560 may be in thermal communication with the module 510 to monitor thermal conditions, such as temperature, of the module 510. A fourth sensor 566 may be disposed within the coolant channel 558 to monitor a flow rate of coolant flowing therethrough. A controller (not shown) may be in electrical communication with the third sensor 560, the fourth sensor 566, and the one or more emitters 530. The controller may operate to control output of the one or more emitters 530 based on signals received from the third sensor 560 and the fourth sensor 566. For example, a flow rate of coolant within the coolant channel 558 may be adjusted in response to, for example, a temperature of the module 510 or a coolant flow rate of the coolant channel 558 being outside of a predetermined threshold.

Figure 14:
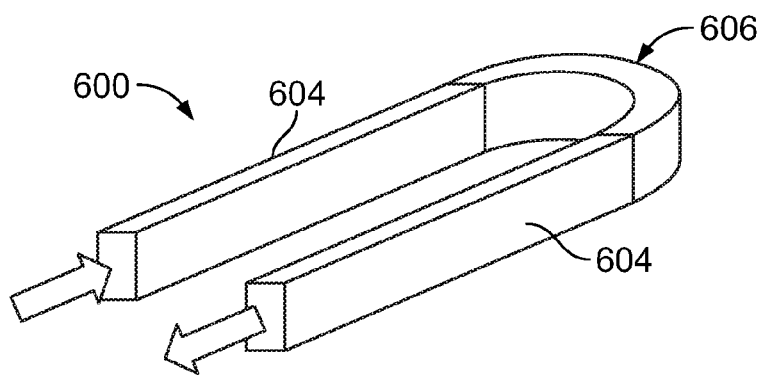
FIG. 14 is an illustrative perspective view of an example of a coolant channel for a thermal management system of a power electronics device including a peristaltic pump assembly.
Figure 15:
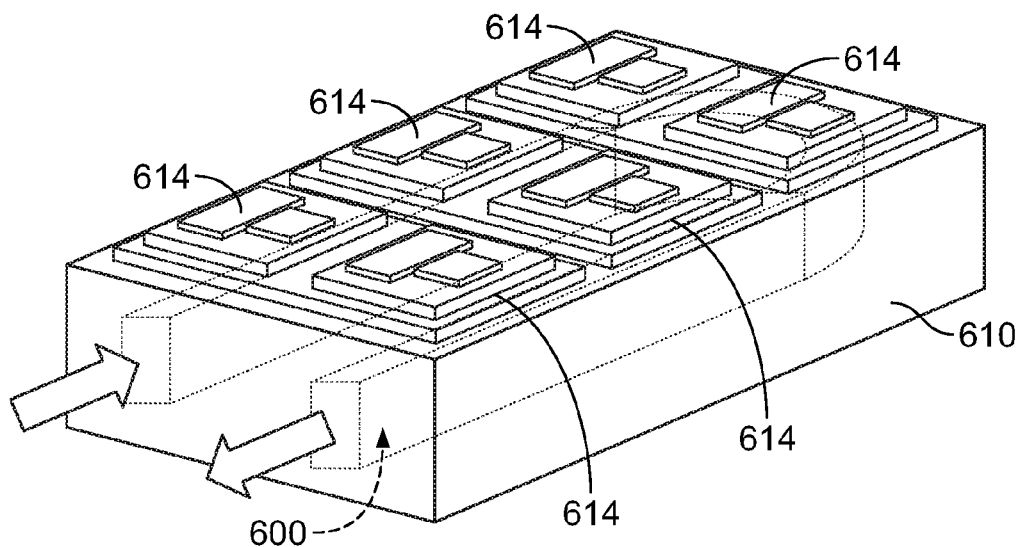
FIG. 15 is an illustrative perspective view of an example of power electronics devices mounted to a support structure housing the peristaltic pump assembly of FIG. 14.

A thermal management system utilizing a peristaltic pump may have various shapes or forms to accommodate complex cooling shapes. FIGS. 14 and 15 show an example of a portion of a peristaltic pump assembly which is U-shaped, referred to generally as thermal management assembly 600. The thermal management assembly 600 may include a coolant channel 604 and a peristaltic pump assembly 606 operating therewith. While the thermal management assembly is shown as U-shaped in FIGS. 14 and 15, it is contemplated that the peristaltic pump assembly 606 may be located adjacent or proximate a bend in the coolant channel 604 which may have alternative shapes. For example, under certain conditions a bend or curve in the coolant channel 604 may result in a pressure drop and/or a reduction in convective heat transfer efficiency. Locating the peristaltic pump assembly 606 adjacent or proximate these bends or curves may assist in combating the pressure drop and/or reduction in convective heat transfer efficiency.

The peristaltic pump assembly 606 may include one or more emitters to influence actionable particles within the coolant channel 604 as described above. A support structure 610 may house the thermal management assembly 600. The support structure 610 may define a cavity sized to receive the thermal management assembly 600. One or more power electronics devices 614 may be arranged with the support structure 610 for thermal communication with the coolant channel 604. For example, the thermal management assembly 600 may be arranged with the power electronics devices 614 such that the coolant channel 604 is oriented adjacent the power electronics devices 614 for thermal communication therewith. This orientation may provide for targeted delivery of coolant flowing within the coolant channel 604 to draw heat from the power electronics devices 614. While FIG. 15 shows six power electronics devices 614, it is contemplated that more or less power electronics devices 614 may benefit from a structure in which the coolant channel 604 is adjacent thereto.

Figure 16:
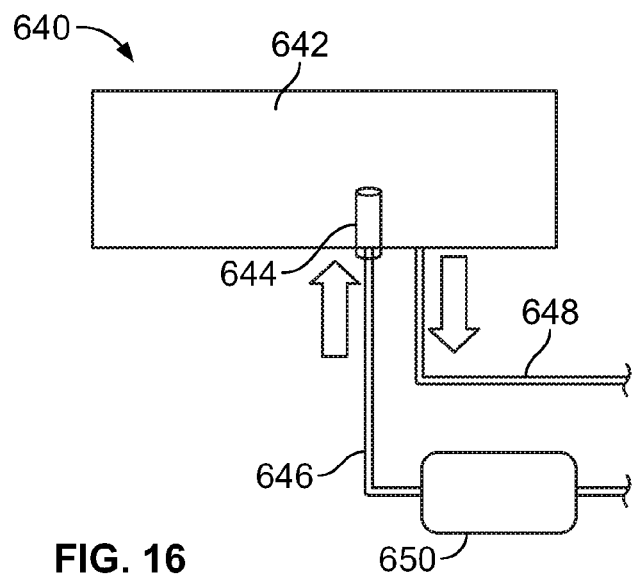
FIG. 16 is a schematic diagram illustrating a portion of a thermal management system of a power electronics module including a peristaltic pump assembly.

FIG. 16 shows an example of a location in which a peristaltic pump assembly may operate with a power electronics device, referred to generally as a system 640. The system 640 includes a power electronics device 642. The power electronics device 642 may include an AC/DC inverter, a DC/DC converter, an AC/DC rectifier, or one or more power devices such as transistors or diodes. The power electronics device 642 may include a stack of metallic and dielectric layers as described above. The system 640 may further include a peristaltic pump assembly 644, an inlet coolant channel 646, an outlet coolant channel 648, and a pump 650. The peristaltic pump assembly 644 may supplement operations of the pump 650 or may operate without the pump 650. For example, the peristaltic pump assembly 644 may be arranged with the inlet coolant channel 646 and the adjacent power electronics device 642 to adjust a flow rate of coolant flowing to the outlet coolant channel 648. The peristaltic pump assembly 644 may, for example, increase a flow rate of coolant flowing through the power electronics device 642 to assist in cooling the power electronics device 642 which may be above a predetermined threshold.

Each of the coolant channels described above may be a component of a conduit system to deliver coolant for thermally communicating with a power electronics device and may define a flow path for coolant. Examples of coolant suitable for use with the peristaltic pump assemblies described above include glycol, water, mineral oil, and synthetic oil. Incorporating a peristaltic pumping motion in the coolant channels may also provide additional control options relating to coolant flow. For example, a distributed system of coolant channels with moveable walls may influence coolant motion by locally and dynamically manipulating coolant flow at different locations with the conduit system. The moveable walls may be located at portions of the coolant flow path where geometry negatively impacts coolant flow, such as at bends or turns in the cooling channels.

The proposed systems and pump assemblies described above may also enhance thermal management of power electronics devices during normal vehicle operations, drive cycles, and cold start operations by selectively activating the systems or pump assemblies based on measured conditions to compensate for temperature or flow fluctuations. The systems and assemblies described above may also enhance thermal management of power electronics devices during charge operations to use power from a charging station for the system or pump assembly while the vehicle is off.

While various embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to marketability, appearance, consistency, robustness, customer acceptability, reliability, accuracy, etc. As such, embodiments described as less desirable than other embodiments or prior art implementations with respect to one or more characteristics are not outside the scope of the disclosure and can be desirable for particular applications.

What is claimed is:

1. A power electronics assembly comprising:
   a packaging assembly supporting a power electronics device;
   a thermal management system supporting the packaging assembly and including a thermal plate including a solid wall including magnetic particles defining a channel; and
   two emitters sequentially arranged along and external to the channel to each impart a force upon the wall via a magnetic field to operate as a peristaltic pump to adjust a channel cross-sectional area to control coolant flow.

2. The power electronics assembly of claim 1, wherein the packaging assembly comprises a dielectric layer disposed between two metallic layers.

3. The power electronics assembly of claim 1, wherein, each of the two emitters is an electromagnet to selectively output the magnetic field to impart the force on the magnetic particles to adjust the cross-sectional area of the channel.

4. The power electronics assembly of claim 1 further comprising another power electronics device supported by the packaging assembly and proximate to the thermal management system, wherein the channel is U-shaped and aligned to span adjacent to the power electronics device and the another power electronics device for targeted delivery of the coolant.

5. The power electronics assembly of claim 1, wherein the peristaltic pump is located adjacent a bend in a conduit system including the channel.

6. The power electronics assembly of claim 1 further comprising:
   a sensor to measure a flow rate of the coolant flowing within the system; and
   a controller in electrical communication with the sensor and the two emitters and programmed to activate the two emitters based on signals from the sensor indicating a flow condition outside of a predetermined flow rate range to manipulate the flow rate of the coolant through at least a portion of the channel.

7. A power electronics assembly comprising:
   first and second thermal plates, each of the first and second thermal plates including:
      an inner wall and an outer wall, the outer wall including one of dielectric particles or magnetic particles;
      a channel defined between the inner and outer walls; and
      a pair of emitters, each of the pair of emitters sequentially arranged along and external to the outer walls to form a peristaltic pump to impart a force to manipulate a cross-sectional area of the channel to control a rate of coolant flow therethrough; and
   a power electronics device disposed between the inner walls of the first and second thermal plates,
   wherein each emitter of the pair of emitters outputs one of:
      a magnetic field to move the magnetic particles, and
      a voltage or an electric field to move the dielectric particles
   to manipulate the cross-sectional area of the channel to control the coolant flow therethrough.

8. The power electronics assembly of claim 7, wherein each of the outer walls includes the magnetic particles and wherein each emitter of the pair of emitters is an electromagnet to selectively output the magnetic field to impart the force on the magnetic particles to adjust the cross-sectional area of the channel.

9. The power electronics assembly of claim 7, wherein each of the outer walls includes the dielectric particles and wherein each emitter of the pair of emitters outputs the voltage or the electric field to impart a dielectrically driven compression force on the dielectric particles to adjust the cross-sectional area of the channel.

10. The power electronics assembly of claim 9, wherein the dielectric particles have one of piezoelectric properties or electrostriction properties.

11. The power electronics assembly of claim 7, wherein each emitter of the pair of emitters is arranged such that the imparted forces from each of the pair of emitters is induced in a direction toward the inner wall.

12. A power electronics assembly comprising:
a pair of power electronics devices;
first and second thermal plates, each of the first and second thermal plates including:
  a channel defined by a solid inner wall and a solid outer wall; and
  a plurality of emitters sequentially arranged along and between the inner walls of the first and second thermal plates to form a pair of peristaltic pumps that each selectively outputs a force to simultaneously move each inner wall and adjust a cross-sectional area of each channel to control coolant flow therethrough; and
each of the power electronics devices disposed adjacent to a respective one of the outer walls,
wherein each of the emitters outputs one of:
  a magnetic field to move magnetic particles, or
  a voltage or an electric field to move dielectric particles to manipulate the cross-sectional area of each channel to control the coolant flow therethrough.

13. The assembly of claim 12, wherein each inner wall includes the dielectric or magnetic particles susceptible to movement based on activation of one of the plurality of emitters.

14. The assembly of claim 13, wherein each of the plurality of emitters is an electromagnet.

15. The assembly of claim 12 further comprising:
a sensor to measure a temperature of one of the pair of power electronics devices; and
a controller in electrical communication with the sensor and each of the plurality of emitters, the controller programmed to activate each of the plurality of emitters based on signals from the sensor indicating the temperature above a predetermined threshold to manipulate a flow rate of the coolant through at least a portion of one of the channels located adjacent to the one of the pair of the power electronics devices.

16. The assembly of claim 12 further comprising:
a sensor to measure a flow rate of coolant flowing within one of the channels; and
a controller in electrical communication with the sensor and each of the plurality of emitters, the controller programmed to activate each of the plurality of emitters based on signals from the sensor indicating the flow rate outside of a predetermined flow rate range to manipulate a coolant flow rate of the coolant through at least a portion of the one of the channels.

* * * * *